(12) United States Patent
Cornwell et al.

(10) Patent No.: US 7,609,561 B2
(45) Date of Patent: Oct. 27, 2009

(54) DISABLING FAULTY FLASH MEMORY DIES

(75) Inventors: Michael J. Cornwell, San Jose, CA (US); Christopher P. Dudte, San Jose, CA (US)

(73) Assignee: Apple Inc., Cupertino, CA (US)

( * ) Notice: Subject to any disclaimer, the term of this patent is extended or adjusted under 35 U.S.C. 154(b) by 281 days.

(21) Appl. No.: 11/334,087

(22) Filed: Jan. 18, 2006

(65) Prior Publication Data

US 2007/0165461 A1     Jul. 19, 2007

(51) Int. Cl.
    *G11C 16/04*     (2006.01)
(52) U.S. Cl. .......................... 365/185.33; 365/185.09; 365/195
(58) Field of Classification Search ............ 365/185.33, 365/195, 200, 185.09, 189.07
See application file for complete search history.

(56) References Cited

U.S. PATENT DOCUMENTS

| | | | |
|---|---|---|---|
| 4,992,984 A | 2/1991 | Busch et al. | |
| 5,473,753 A | 12/1995 | Wells et al. | |
| 5,577,194 A | 11/1996 | Wells et al. | |
| 5,592,641 A | 1/1997 | Fandrich et al. | |
| 5,602,987 A | 2/1997 | Harari et al. | |
| 5,671,229 A | 9/1997 | Harari et al. | |
| 5,691,945 A * | 11/1997 | Liou et al. | 365/200 |
| 5,719,808 A | 2/1998 | Harari et al. | |
| 5,812,861 A * | 9/1998 | Ishac et al. | 713/324 |
| 5,848,009 A | 12/1998 | Lee et al. | |
| 5,880,996 A | 3/1999 | Roohparvar | |
| 5,901,105 A * | 5/1999 | Ong et al. | 365/230.06 |
| 5,946,257 A | 8/1999 | Keeth | |
| 5,999,480 A * | 12/1999 | Ong et al. | 365/230.06 |
| 6,014,755 A | 1/2000 | Wells et al. | |
| 6,078,540 A * | 6/2000 | Keeth | 365/226 |
| 6,148,435 A | 11/2000 | Bettman | |
| 6,149,316 A | 11/2000 | Harari et al. | |
| 6,269,025 B1 | 7/2001 | Hollmer et al. | |
| 6,304,487 B1 | 10/2001 | Pawletko et al. | |
| 6,356,498 B1 * | 3/2002 | Keeth | 365/226 |
| 6,426,893 B1 | 7/2002 | Conley et al. | |
| 6,721,820 B2 | 4/2004 | Zilberman et al. | |
| 6,748,562 B1 | 6/2004 | Krech, Jr. et al. | |
| 6,757,842 B2 | 6/2004 | Harari et al. | |
| 6,763,424 B2 | 7/2004 | Conley | |
| 6,914,846 B2 | 7/2005 | Harari et al. | |
| 6,947,332 B2 | 9/2005 | Wallace et al. | |

(Continued)

FOREIGN PATENT DOCUMENTS

WO     98/15149     9/1998

OTHER PUBLICATIONS

K9XXG08UXM—Preliminary Flash Memory—Samsung Electronics, pp. 1-44.

(Continued)

*Primary Examiner*—Gene N. Auduong
(74) *Attorney, Agent, or Firm*—Fish & Richardson P.C.

(57) ABSTRACT

Articles and associated methods and systems relate to disabling defective flash memory dies in a device containing multiple flash memory dies. Packages containing multiple flash memory dies may be labeled to indicate a flash memory data storage capacity based on the flash memory dies that are not disabled. Various disabling methods may be applied at the die level, package level, and/or board level.

16 Claims, 4 Drawing Sheets

U.S. PATENT DOCUMENTS

| | | | |
|---|---|---|---|
| 6,956,769 | B2 | 10/2005 | Lee |
| 7,137,011 | B1 | 11/2006 | Harari et al. |
| 7,162,569 | B2 | 1/2007 | Conley et al. |
| 7,237,046 | B2 | 6/2007 | Paley et al. |
| 7,237,074 | B2 | 6/2007 | Guterman et al. |
| 7,240,219 | B2 | 7/2007 | Teicher et al. |
| 7,277,337 | B1 * | 10/2007 | Co et al. .................... 365/200 |
| 2001/0052637 | A1 * | 12/2001 | Akram et al. ............... 257/666 |
| 2003/0007399 | A1 | 1/2003 | Kinoshita et al. |
| 2004/0172576 | A1 | 9/2004 | Yoshii et al. |
| 2005/0023656 | A1 * | 2/2005 | Leedy ........................ 257/678 |
| 2006/0216841 | A1 * | 9/2006 | Murin et al. .................. 438/17 |

OTHER PUBLICATIONS

"Common Flash Memory Interface Specification," Release 2.0, Dec. 1, 2001; pp. 1-25.

"17.3 RAIDO-Striping," by T. Rhodes and M. Stokely; FreeBSD Handbook, Chpt 17 GEOM: Modular Disk Transformation Framework; pp. 1-3.

"Two Technologies Compared: NOR vs. NAND White Paper," Jul. 2003, 91-SR-012-04-8L, Rev 1.1, pp. 1-14.

"ATA Flash Disk Controller," 2004 Silicon Storage Technology, Inc.; pp. 1-76.

"512M × 8 Bit / 1G × 8 Bit NAND Flash Memory," Flash Memory, Samsung Electronics, pp. 1-38.

"RAID," SearchWinSystems.Com Learning Guide: Backup Solutions, pp. 1-3.

"Advanced Technology Attachment," http://foldoc.doc.ic.ac.uk/foldoc.

"Portalplayer, Inc.—Products," http://www.portalplayer.com/products/index.html, pp. 1-5.

The extended European Search Report, 07000800.8-2210 date mailed Aug. 10, 2007, 8 pages.

Chinese Examiner Wu Yun, The Patent Office of the People's Republic of China Non-Final Office Action in Chinese Appl. No. 200710002283.3, mailed Apr. 17, 2009, 6 pages.

\* cited by examiner

DISABLING FAULTY FLASH MEMORY DIES

TECHNICAL FIELD

Various implementations may relate generally to flash memory devices, and particular implementations may relate to methods and systems for disabling faulty dies in flash memory devices.

BACKGROUND

As computing devices have increased in capabilities and features, demand for data storage devices has grown. Data storage devices have been used, for example, to store program instructions (i.e., code) that may be executed by processors. Data storage devices have also been used to store other types of data, including audio, image, and/or text information, for example. Recently, systems with data storage devices capable of storing substantial data content (e.g., songs, music videos, etc. . . . ) have become widely available in portable devices.

Such portable devices include data storage devices that have small form factors and are capable of operating from portable power sources, such as batteries. Some data storage devices in portable devices may provide non-volatile memory that is capable of retaining data when disconnected from the power source. Portable devices have used various non-volatile data storage devices, such as hard disc drives, EEPROM (electrically erasable programmable read only memory), and flash memory.

Flash memory has become a widely used type of semiconductor memory. Flash memory may provide a non-volatile memory in portable electronic devices and consumer applications, for example.

Two types of flash memory are NOR flash and NAND flash. In general, NOR flash may differ from NAND flash in certain respects. For example, NOR flash typically provides the capacity to execute code in place, and is randomly accessible (i.e., like a RAM). For example, NOR flash may provide code storage and direct execution in portable electronics devices, cell phones, and PDAs.

In comparison, NAND flash can typically erase data more quickly, access data in bursts (e.g., 512 byte chunks), and may provide more lifetime erase cycles than comparable NOR flash. NAND flash may generally provide non-volatile storage at a low cost per bit as a high-density file storage medium for consumer devices, such as digital cameras and MP3 players, for example. NAND flash may also be used for applications such as data storage in camera cell phones.

In some flash memory manufacturing environments, a small percentage of flash memory dies may have defects that may be detected by testing. One example of a defect is a bit error at a particular memory location. Some defects may be compensated for by techniques such as redirecting read/write accesses from defective memory locations to a set of redundant memory locations.

In some cases, more than one die of flash memory may be assembled together into a single integrated circuit (IC) package. In such multi-die flash memory packages, tests may be performed to detect defects in any of the flash memory dies in the package. The entire package may be discarded if any individual flash memory die in the package has more than an acceptable number of defects.

SUMMARY

Articles and associated methods and systems relate to disabling defective flash memory dies in a device containing multiple flash memory dies. Packages containing multiple flash memory dies may be labeled to indicate a flash memory data storage capacity based on the flash memory dies that are not disabled. Various disabling methods may be applied at the die level, package level, and/or board level.

Some implementations may provide one or more advantages. For example, a disabling mechanism for a die avoids the need for complex error detection and correction mechanisms to compensate for die having significant but acceptable number of defects. By disabling an entire die, the resulting data storage capacity may fall within one of a number of standard memory capacity values. Furthermore, labor savings, increased revenue, and decreased operating costs may be achieved by labeling multi-die flash memory for sale or use at a reduced storage capacity. This may be a cost-effective alternative to discarding an operational flash memory package. The ability to recapture a substantial portion of the value invested in manufacturing a multiple die flash memory device may effectively mitigate some of the financial risk associated with multiple die flash memory packages, thereby promoting the use of such flash memory devices.

The details of one or more implementations of the invention are set forth in the accompanying drawings and the description below. Other features of the invention will be apparent from the description and drawings, and from the claims.

DESCRIPTION OF DRAWINGS

Like reference symbols in the various drawings indicate like elements.

DETAILED DESCRIPTION OF ILLUSTRATIVE IMPLEMENTATIONS

Figure 1:
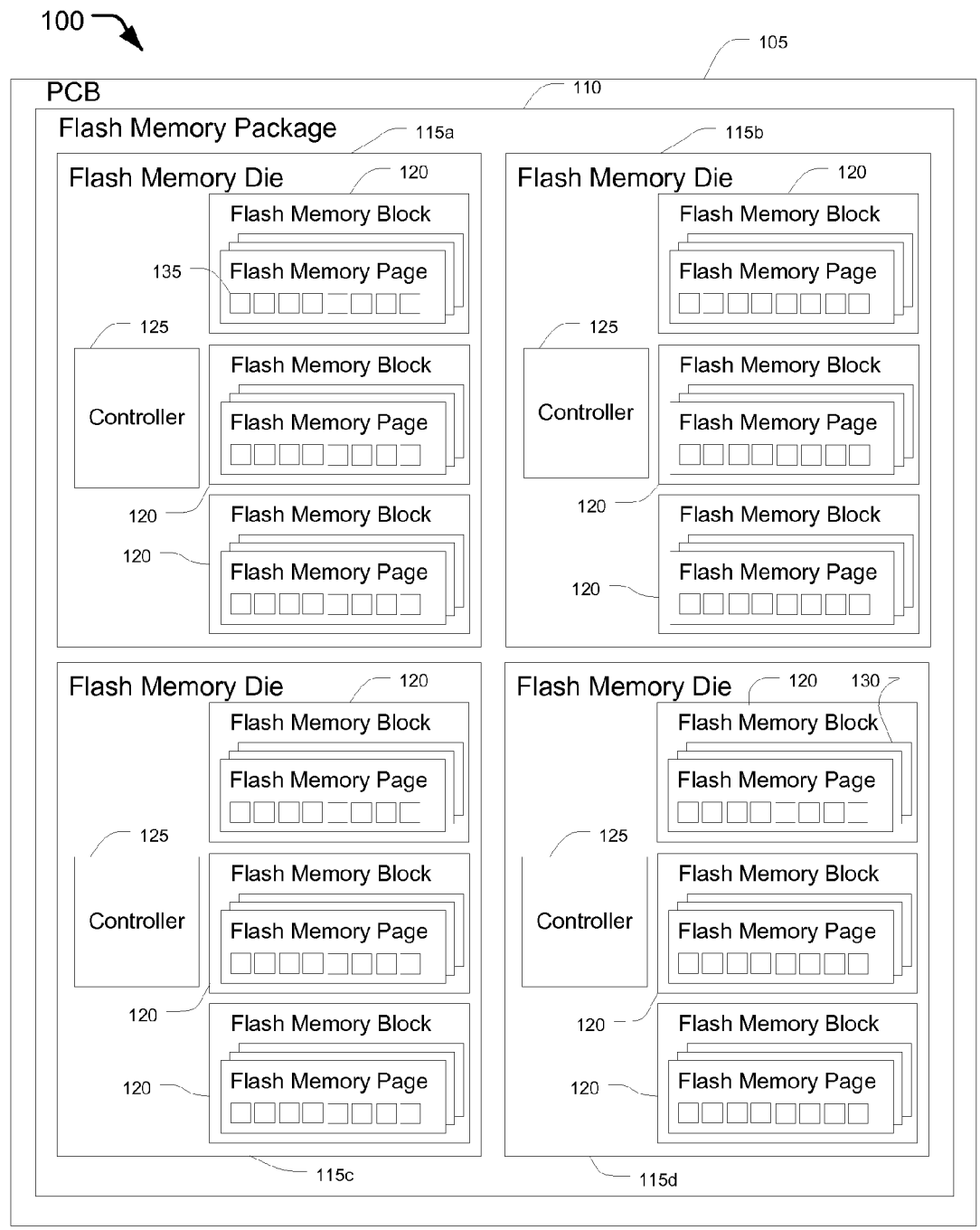
FIG. 1 is a schematic diagram showing an example of an organizational structure for a multiple-die flash memory package on a printed circuit board.

FIG. 1 shows an example of an organizational structure 100 for a multiple-die flash memory package. The organizational structure 100 may be used in various applications, such as portable music devices, personal digital assistants, cell phones, handheld or laptop computers, and embedded systems, for example. The structure 100 includes a printed circuit board (PCB) 105 on which a flash memory package 110 may be mounted.

A flash memory package may include any practical number of flash memory dies, such as two, three, four, eight, or sixteen, for example. The flash memory package 110 includes four flash memory dies 115a, 115b, 115c, and 115d. During its manufacture, the flash memory package 110 may be tested. In some implementations, the tests may return test performance, such as a test score, for at least one flash memory die. Based on the test performance, some of the flash memory dies in the package may be identified to be defective according to a set of criterion, such as bit error rate, for example.

In some implementations, any individual die that is identified as defective may be disabled. A disabled die may be rendered inaccessible for storing and/or reading stored data.

A variety of apparatus and methods for disabling an individual die are discussed in further detail with reference to FIG. 2.

Rather than discarding all packages that include at least one defective or disabled die, the manufacturer may be able to sell the flash memory for use with the non-disabled die in the package. The manufacturer may provide a label (or other indicia) on such a flash memory package to indicate that the flash memory package has a data storage capacity based on the non-disabled flash memory die(s).

In the example of FIG. 1, each of the flash memory dies 115a, 115b, 115c, 115d in the package 110 includes three flash memory blocks 120 and a controller 125. Some implementations may have more or fewer memory blocks. Each of the flash memory blocks 120 includes multiple (e.g., 64 or 128) flash memory pages 130. Each flash memory page 130 includes multiple flash memory cells 135. The flash memory cells 135 store information by storing charges in the cell. A charge level in a flash memory cell represents the information stored in the cell. In some implementations, the flash memory cells 135 may be single level cells in which each flash memory cell 135 stores one bit of information. In other implementations, the flash memory cells 135 may be multiple levels cells in which each flash memory cell stores more than one bit of information. The flash memory cell 135 may be defective when, for example, it cannot retain its charge level, or it cannot change its charge level, sufficiently to represent all possible bit values.

The flash memory package 110 and the flash memory dies 115a-115d have a designed storage capacity based upon four fully functional dies. For example, each of the flash memory blocks 120 may be designed with a storage capacity of ten megabytes (MB). With three flash memory blocks 120, each of the flash memory dies 115a-115d has a designed storage capacity of 30 MB. With four flash memory dies 115a-115d, the flash memory package 110 is designed to have a storage capacity of 120 MB.

In one example, a manufacturer may test the flash memory package 110 for defective flash memory blocks after the flash memory dies 115a-115d have been packaged into the flash memory package 110. Based on a set of criteria, some of the flash memory dies 115a-115d may be identified as defective. An exemplary test criterion may be a function of a comparison between the number of defective flash memory blocks in a die and a threshold. If the number of defective flash memory blocks in an individual flash memory die exceeds the threshold, then the flash memory die may be identified as defective.

When an individual flash memory die is identified as being defective, a disabling operation may be performed to disable the individual defective die rather than discarding the entire flash memory package. For example, if a test identifies that the flash memory die 115a is defective, instead of discarding the package 110, a disabling mechanism may disable the flash memory die 115a, and the flash memory package may be operated and/or sold with a reduced storage capacity based on the flash memory dies 115b-115d.

In some implementations, a labeling mechanism may be used to associate the disabled status information of the flash memory dies 115a-115d with the flash memory package 110. For example, if the disabling mechanism disables the flash memory die 115a, then a labeling mechanism may label (or otherwise indicate) that the flash memory package 110 may provide a storage capacity based on the storage capacities of dies 115b, 115c, and 115d. In the above example, the labeling mechanism may label the flash memory package 110 with capacity of 90 MB, which is less than its nominal designed capacity of 120 MB. Then, the package 110 can be processed as a package 110 with 90 MB storage capacity. For example, a seller may sell the package as a 90 MB device. Some exemplary disabling mechanisms for disabling at least one flash memory die are shown in FIG. 2.

Figure 2:
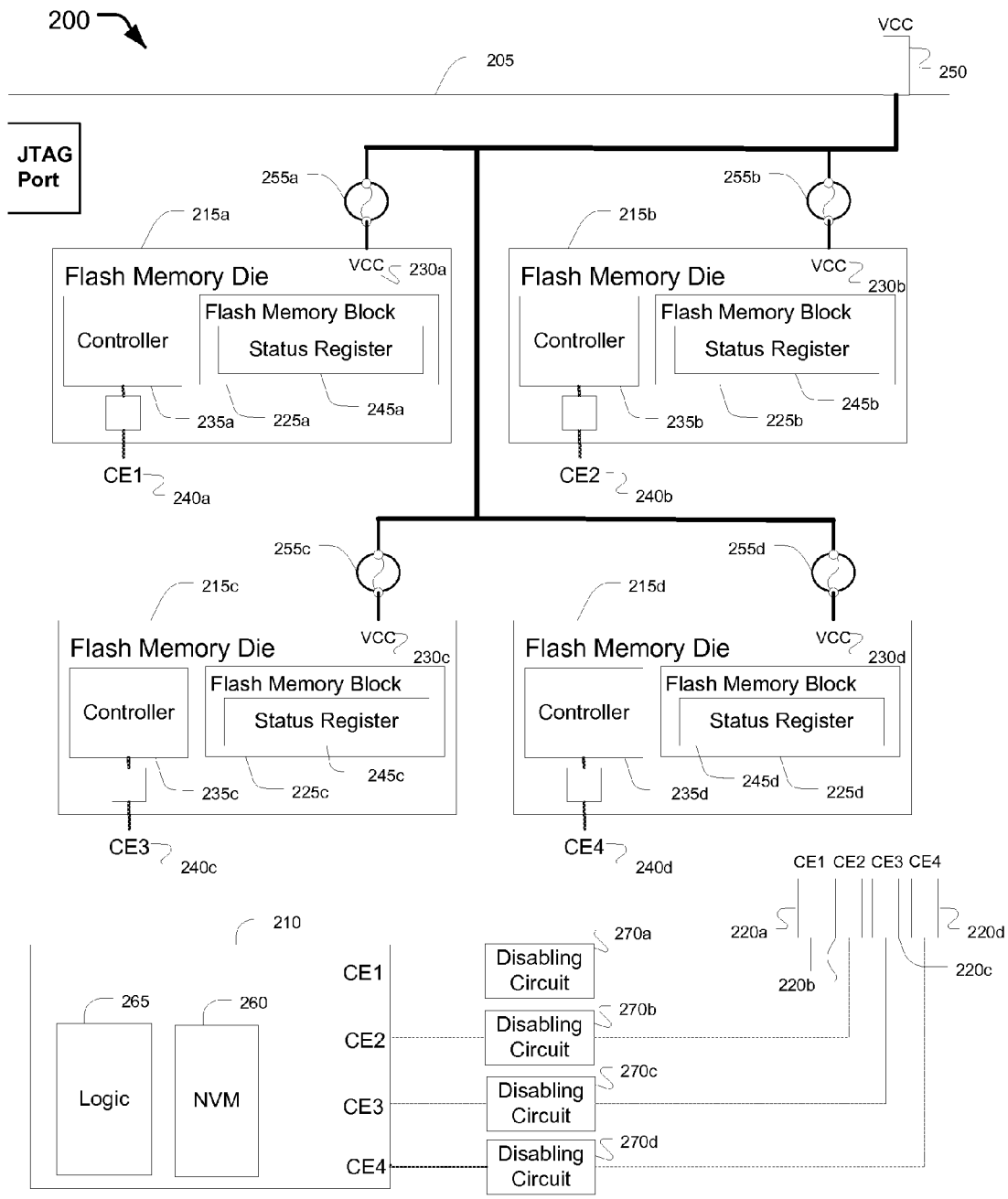
FIG. 2 is a schematic diagram of a flash memory system illustrating a variety of disabling mechanisms for disabling individual die in a flash memory device.

FIG. 2 shows an example of a system 200 that illustrates a variety of disabling mechanisms that may be implemented to disable one or more individual flash memory dies in a flash memory package, such as the flash memory package 110. These mechanisms may be applied at the die level, package level, and/or board level, as appropriate. The disabling mechanisms described herein are representative of possible implementations. These listed disabling mechanisms are intended to be illustrative, and are not intended to be limiting. Other mechanisms may be used, either alone or in combination with the illustrated examples, for disabling an individual die in a flash memory package. Manufacturers or users, for example, may choose one or more of the disabling mechanisms to disable one or more individual die in a flash memory package. In some applications, a combination of disabling mechanisms may be used.

In this example, the system 200 includes a flash memory package 205 and a memory controller 210. The flash memory package 205 may have a similar structure to the flash memory package 110, or they may have different structures. The flash memory package 205 includes four flash memory dies 215a-215d, chip enable input pins 220a-220d, a Vcc input pin 250, and fuses 255a-255b. The flash memory package 205 also includes a JTAG port, which may be used for transferring test instructions or test results, for example, to and/or from a test device. In other embodiments, test instructions or test results may be transferred to and/or from the test device via a standard or custom data interface, which may provide for data transfers using synchronous or asynchronous transmissions of serial or parallel signals in analog and/or digital formats (e.g., out of band signals).

Each of the flash memory dies 215a-215d may receive a chip enable signal via the chip enable pins 220a-220d. Each flash memory die includes a corresponding flash memory block 225a-225d, a Vcc input 230a-230d, a controller 235a-235d, and a chip enable (CE) input 240a-240d. Each CE input 240-240d may be coupled to the chip enable pin 220a-220d, for example, through a bond wire or other conductive path (e.g., in flip-chip packages). Each flash memory block 225a-225d includes a status register 245a-245d that may store the status of each of the flash memory dies 215a-215d in the flash memory package 205. For example, the status registers 245a-245d may each store a set of flags to indicate which of the flash memory dies 215a-215d is to be disabled.

The flash memory dies 215a-215d may draw operating power through a corresponding one of the fuses 255a-255d and the Vcc inputs 230a-230d. The Vcc inputs 230a-230d are connected through fuses 255a-255d, respectively, to a Vcc pin 250 on the flash memory package 205.

The controllers 235a-235d each control read and write accesses to their respective flash memory blocks 225a-225d. For example, the controller 235d may control access to the flash memory die 215d by not responding to a valid chip enable signal on the CE4 input 240d. In some implementations, each of the CE inputs 240a-240d may connect to the corresponding CE pins 220a-220d, respectively, through bond wires (not shown).

Also in this example, the memory controller 210 is external to the flash memory package 205. In some implementations, the memory controller 210 may be integrated into the package 205 with the flash memory dies 215a-215d. In other implementations, the controller 210 may be mounted on the same PCB with the flash memory package 205, or located on another PCB or substrate and connected to the flash memory package 205 via a communication link, such as a cable, for example.

The controller 210 of this example includes a non-volatile memory (NVM) 260 and a logic 265. The NVM 260 may store enabling rules for the flash memory dies 215a-215d and/or it may store the status of the flash memory dies 215a-215d, such as the addresses of defective flash memory dies, for example. The logic 265, which may include digital and/or analog hardware, and may perform operations upon the execution of instructions, may generate control signals according to the stored rules. In this example, the CE1-CE4 outputs on the controller 210 are connected to the CE1-CE4 pins 220a-220d on the package 205 through disabling circuits 270a-270d.

When a die in a flash package is to be disabled, various mechanisms can be used to disable one or more selected flash memory dies at the die level, package level, and/or board level.

At the die level, disabling mechanisms located substantially within each of the dies 215a-215d may involve, for example, applying a command to a selected one of the controllers 235a-235d, and/or storing copies of the disabled die status information for the flash memory dies 215a-215d in the status registers 245a-245d. For example, if the flash memory die 215b is to be disabled, a disabling mechanism may apply a command to the controller 235b to cause the controller 235b to block (e.g., not process) requests to access memory locations in the die 215b. In some implementations, copies of the disabled die status information may be maintained in other (non-disabled) die, or in a register that is separate from the disabled die. In another example, a disabling mechanism may also set the status of the selected flash memory dies as "defective" in the status registers 245a-245d. When the memory controller 210 or the controllers 235a-235d of the selected memory dies read this status information, the controllers 235a-235d may be configured to prevent the defective flash memory dies from being enabled and/or accessed. Some operations at the die level may be performed on a die that is unpackaged (e.g., sawn wafer), in the process of being packaged, and/or fully enclosed in a package.

In one example, a flash vendor may "mark" a block of cells, for example, as not to be used, for example, by storing a flag at the beginning of the block that, when read by a processor or controller, will inhibit reading and/or writing to the marked block. Flags may be placed, for example, at a designated location in the flash memory and/or in a register. A flag may be placed to disable one or more blocks of memory, up to and including an entire die. Such a flag may contain indicia about the disabled memory. For example, the indicia may indicate a size of the memory to disable, a status (e.g., defective, non-defective), and/or an effective usable storage capacity of the disabled memory. In various implementations, the effective usable storage capacity of the disabled memory may be, for example, 100%, above about 99%, between about 96% and about 99%, at least about 95%, at least about 90%, or below 90%. Some implementations may permit one or more levels of access to the storage capacity of any disable die, and the access levels may be password protected.

At the package level, disabling mechanisms located substantially within the package 205 may involve, for example, physically disabling connections from an individual die 215a-215d to the corresponding CE pins 220a-220d, and/or open circuiting power supply connections by cutting such connections (e.g., with a laser). Physically disabling the chip enable signal within the package may involve not populating or cutting a bond wire between a selected one of the CE pads (e.g., bond pads) 240a-240d and the corresponding CE pins 220a-220d. For example, the disabling mechanism may cut or not connect the bond wire from the CE2 pin 240b to the CE2 pin 220b to disable the flash memory die 215b. Alternatively, a particular chip enable signal line may be disabled by cutting a signal path for the chip enable signal. Open circuiting power supply connections may involve disabling one of the flash memory dies 215a-215d by blowing a selected one of the fuses 255a-255d that connects the die to the power supply, or otherwise cutting the connection between the die and the power supply pin 250. The cutting may involve techniques such as laser cutting, for example. Some operations at the package level may be performed on a die that is in the process of being packaged and/or fully enclosed in a package.

In various implementations, packages of various types may be modified or manipulated to effectively disable an individual flash memory die. In a ball grid array (BGA) package, for example, an electrical path between a substrate bond wire pad for a CE input to a flash memory die may be cut or otherwise left unconnected from a corresponding solder ball. As another example, a CE input pin of a thin small outline package (TSOP) may be physically cut or otherwise prevented from making electrical connection to a circuit outside of the TSOP package.

At the board level, various methods for disabling defective die may be implemented by circuit elements located substantially external to the flash memory package 205. For example, the controller 210 may be configured to disable any of the flash memory dies 215a-215d in the system 200 in response to a command from a host (not shown). The controller 210 and/or the disabling circuits 270a-270d may be implemented, for example, in a test fixture for operating with the flash memory package at one or more stages of the manufacturing process, for example, by using a socket to make electrical connections to the CE pins 220a-220d. In another example, similar circuits (not shown) may be coupled to the JTAG port. During the manufacturing process, these or other circuit elements external to the flash memory package 205 may, for example, operate to send signals to the flash memory package to disable selected ones of the dies 215a-215d. Signals to disable one or more selected dies may be communicated, in various implementations, using out-of-band (OOB) signaling to an appropriate receiving element in the flash memory package, via the CE pins 215a-215d, the JTAG port, either alone or in combination with signals applied to one or more other pins (not shown), such as data, address, and/or control input pins.

In some implementations, the controller 210 may activate the disabling circuits 270a-270d to disable external signals from driving the CE pins 220a-220d, such as in, for example, a multi-chip module.

In some implementations, each of the flash memory dies 215a-215d may be disabled by manipulating the appropriate chip enable signals to the corresponding chip enable pins 220a-220d. For example, the controller 210 may be configured to prevent a disabled one of the dies 215a-215d from receiving a chip enable signal at pins 220a-220d. In implementations in which the CE1-CE4 outputs of the controller 210 directly drive the CE inputs 220a-220d, the outputs may be maintained at a signal level that does not enable a selected one (or more than one) of the dies 215a-215d. In other implementations, the controller 210 and/or the disabling circuits 270a-270d may be operated to disable one or more selected chip enable signals.

In some implementations, the board-level disabling circuits 270a-270d may use various hardware and/or software implementations to programmably disable selected chip enable signals. For example, the disabling circuit 270c may disable the flash memory die 215c if a circuit element (e.g., pull up-resistor, series resistor, jumper connection) is depopulated so as to prevent the CE3 pin 220c of the package 205 from receiving a chip enable signal. As another example, the disabling circuit 270c may disable the flash memory die 215c if a signal path is shorted to a rail (e.g., Vcc or ground) by a shorting path (e.g., populated with a substantially zero Ohm resistor or diode, active pull-up or pull-down transistor) to effectively short the chip enable signal transmission line so that the CE3 pin 220c may not receive a valid chip enable signal. In some implementations, the disabling circuits 270a-270d are analog switches and/or multiplexers that can connect or disconnect signals to the chip enable pins 220a-220d under the control of the controller 210, for example. In other implementations, the disabling circuits 270a-270d may be controllable buffers that can be individually controlled to disable a corresponding one of the flash memory dies 215a-215d.

Using information stored in the NVM 260, such as the rules for enabling and the status of flash memory dies, for example, the memory controller 210 may execute commands to disable a flash memory die by controlling the output to each of the CE pins 220a-220d. For example, if the memory controller 210 receives a command to disable the flash memory die 215d, then the memory controller 210 may be configured not to send a chip enable signal to the CE4 pin on the controller 210. Also, a disabling mechanism may activate one of the disabling circuits 270a-270d in a variety of ways to disable communication of the chip enable signal between the memory controller 210 and the flash memory package 205.

In an example, a controller may be receive a command to address a flash memory device as having a specified size, the size being an argument or a parameter associated with the command. Such a command may cause a controller to address only 3 Gigabytes of a flash memory that has a four dies of 1 Gigabyte storage capacity each. As such, the command received by the controller may effectively disable one die in the flash memory.

Figure 3:
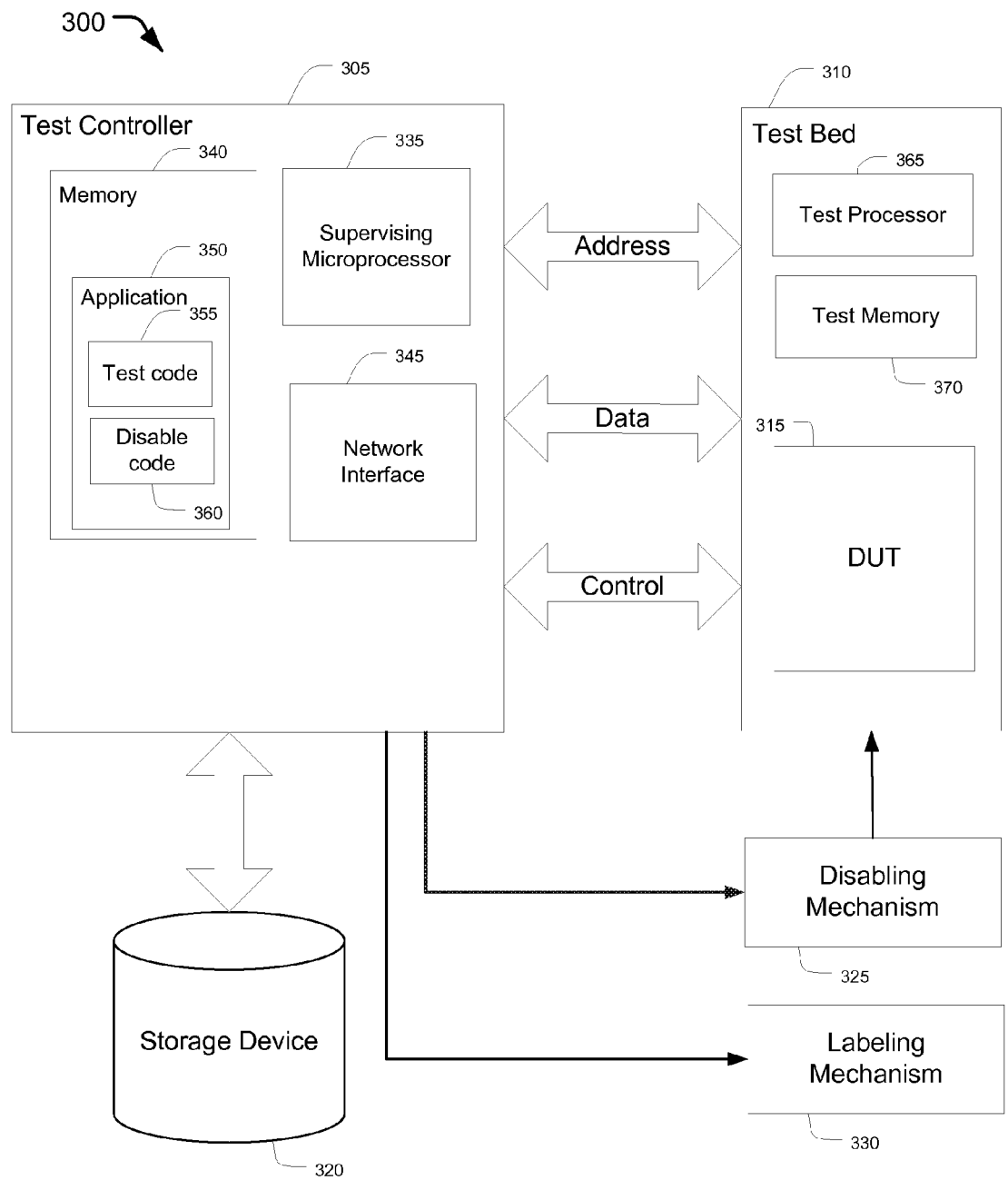
FIG. 3 is a block diagram showing a system for testing flash memory, disabling defective flash die, and providing a label.

FIG. 3 shows an exemplary test environment 300 that is capable of testing a flash memory, identifying defective dies, disabling or providing for future disabling of the defective dies, and labeling the flash memory device to indicate the storage capacity of the flash dies that are not to be disabled. In some implementations, future disabling may involve, for example, setting a disable flag in one of the status registers 245a-245d. When that set flag is read during a future operation, the corresponding controller 235a-235d and/or the external controller 210 may perform one or more operations, such as those described herein, to effectively disable the die that is associated with the disable flag.

In this example, the test environment 300 includes a test controller 305 and a test bed 310. The test controller 305 may perform operations to test a device under test (DUT) 315 on the test bed 310. The DUT 315 may be, for example, a set of flash memory dies, a wafer of flash memory dies, a flash memory mounted on a carrier substrate or in package, or a flash memory package mounted on a PCB. The test controller 305 stores the overall test result in a storage device 320.

After performing a test, the test controller 305 may retrieve failure information from a storage device 320 and operate a disabling mechanism 325 to disable any failed or defective flash memories in the test bed 310. A labeling mechanism 330 may then be activated to associate failure information with the DUT 315.

The test controller 305 includes a supervising microprocessor 335, a memory 340, and a network interface 345. The memory 340 stores an application program 350 that the supervising microprocessor 335 may execute to perform a test. In this example, the application program 350 includes a test code module 355 and a disable code module 360. The supervising microprocessor 335 may execute the test code module 355 by sending test instructions through the network interface 345, which may include a JTAG or other (e.g., USB, parallel, RS-232, infrared, Ethernet) port, for example, to the test bed 310. Along with the DUT 315, the test bed 310 includes a test processor 365 and a test memory 370.

The supervising processor 335 may execute the test code 355 to initialize a test, for example, by signaling the test processor 365 to initialize the DUT 315 and to load parameters (e.g., a test pattern) into the test memory 370. The supervising processor 335 may then instruct the test processor 365 to run the test. When the test bed 310 finishes a test, the test bed 310 sends the test results to the test controller 305. If there are more tests to be run, the test controller 305 may load and run another test on the DUT 315. When all of the tests are done, the test controller 305 may calculate the overall score of the DUT 315 based on the test results and identify any flash memory dies in the DUT 315 that are defective. In some implementations, the number and types of errors that are detected during the test may be compared to thresholds to determine whether the errors are acceptable (i.e., non-defective) for each die. Then, the test controller 305 may activate the disabling mechanism 325 to disable the defective die(s) in the DUT 315. The disabling mechanism 325 may disable defective individual die by providing conditions according to one or more of the disabling mechanisms described elsewhere in this document, such as those described with reference to FIG. 2.

Typically, a flash memory die may be identified as defective if more than a threshold fraction of cells or blocks fail a manufacturer performance test. For example, if more than between about 2% and 4% of the blocks in a flash memory die fail performance testing, then the die may be identified as defective.

In some implementations, if a non-zero number of errors are identified in a die during the test, but the errors fall within acceptable criteria (e.g., number of errors is less than a selected threshold), for example, then the identified errors may be addressed using other compensation (e.g., avoidance) and/or correction techniques. Accordingly, a die may have some errors but may nevertheless be identified as non-defective. Although such dies are not subject to being disabled, accesses to such dies may involve other error compensation methods.

In some implementations, the disabling mechanism 325 may disable the defective dies at the die, package, and/or board level using techniques such as those described with reference to FIG. 2. For example, the disabling mechanism 325 may disable a defective die at the die level by storing its defective status in the status register 245a-245d, at the package level by disconnecting its CE input 240a-240d and/or open-circuiting its fuse 255a-255d, and/or at the board level by providing a command to cause the disabling circuits 270a-270d to disable its chip enable signal.

The test controller 305 may use the labeling mechanism 330 to provide a label to indicate the available flash memory capacity in the package. For example, the label may indicate the available flash memory capacity based on the capacity of flash memory die that are not disabled or identified as failed. The label information may involve coded markings, bar codes, and/or text or graphical representations. The labeling may be implemented, for example, by printed, etching, screening, stamping, laser printing, and/or applying an adhesive and/or pre-printed label that is visible from outside the package.

In some implementations, labeling may involve making one or more internal indications, either alone or in combination with the above-mentioned external markings. For example, information about the available capacity and/or memory map of the available flash memory may be etched, engraved, or otherwise marked internal to the package, such as on a die substrate. If the labeling mechanism is used at the die or wafer level, the labeling information may be applied in an unused or reserved area on the wafer, or on the defective die or group of dies. In some implementations, internal labeling may involve storing digital information in a non-volatile memory in the package or in non-failed dies in the package. For example, labeling information may be stored in a status register and/or in a reserved portion of memory on a non-disabled die in the flash memory package.

In various implementations, the label information may be read, retrieved, or otherwise recalled in a subsequent manufacturing process to sort or to package the flash memory package for use as a memory device with a storage capacity that is based on the labeling information.

Figure 4:
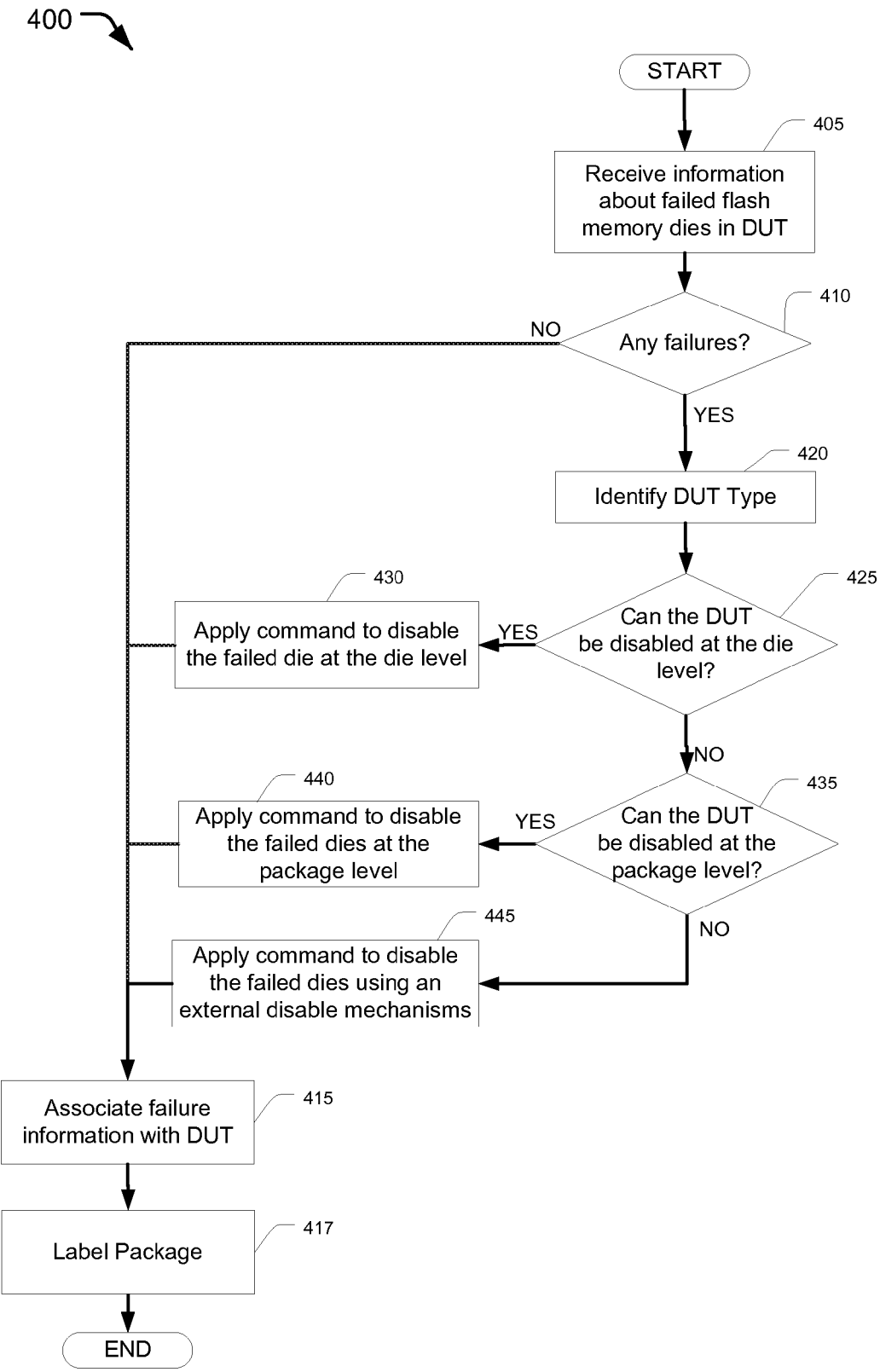
FIG. 4 is a flow diagram illustrating a method for disabling defective dies after a flash memory test is performed.

The test controller 305 may be configured to perform an exemplary method 400, which is illustrated in a flowchart in FIG. 4. The method 400 includes operations that the test controller 305 may perform when executing implementations of the disable code 360. Although the example illustrated in FIG. 3 shows a single block of the disable code 360 stored in the memory 340 for execution by the test controller 305, other processors or logic may perform some or all of the operations, and may use instructions that are stored in locations other than in the memory 340.

In this example, the method 400 begins at step 405 when the test controller 305 receives failure information about failed die in the DUT 315. The test controller 305 checks at step 410 whether the DUT 315 contains any failed die. If the test controller 305 identifies that the flash memory package contains no defective die to be disabled, then the test controller 305 associates, at step 415, failure information (in this example, no die are defective) with the DUT 315, for example, by storing the failure information in a database, an example of which is the storage device 320. In accordance with the implementations described above with reference to FIG. 3, the labeling mechanism 330 may apply, at step 417, one or more external and/or internal indications of the available memory capacity in the package, and then the method 400 ends.

However, if at least one defective die is identified at step 410, then the test controller 305 may identify the DUT type at step 420. Examples of test types include tests performed on unsawn wafers, dies, groups of dies, packaged dies, and/or packages connected to an external circuit (e.g., on a PCB), an example of which is described with reference to FIG. 2.

The test controller 305 then, at step 425, checks whether the disabling mechanism 325 can disable the defective die in the DUT 315 at the die level according to the identified DUT type. If the test controller 305 determines that the disabling mechanism 325 can disable the DUT 315 at the die level, then the test controller 305 may apply, at step 440, a command to the disabling mechanism 325, which may disable the failed dies at the die level. For example, the test controller 305 may send a command to the disabling mechanism 325 to apply a command to the controllers 235a-235d in the flash memory dies 215a-215d, to store status information pertaining to one or more of the flash memory dies 215a-215d in the status registers 245a-245d, or to disconnect the CE input 240a-240d of the failed die from the corresponding CE pin 220a-220d. After disabling all the failed flash memory dies (if any), the test controller 305 performs step 415.

However, if, at step 425, the test controller 305 determines that the disabling mechanism 325 cannot disable the DUT 315 in the die level, then the test controller 305 checks, at step 435, whether the disabling mechanism 325 can disable the DUT 315 at the package level according to the identified DUT type. If the test controller 305 determines that the disabling mechanism 325 can disable the DUT 315 at the package level, then the test controller 305 may apply, at step 440, a command to the disabling mechanism 325 to disable the failed dies at the package level. For example, the test controller 305 may apply a command to the disabling mechanism 325 to physically disconnect the appropriate CE pins 220a-220d, and/or to blow the fuse 255a-255d (e.g., using a laser, excess current, etc. . . . ) that connects the power supply to the defective die. After disabling all the failed flash memory dies, the test controller 305 performs step 415.

If, at step 425, the test controller 305 determines that the disabling mechanism 325 cannot disable the DUT 315 at the package level, then, at step 445 the test controller 305 sends a command to use an external disabling mechanism to disable the failed dies. For example, the test controller 305 may send a command to the external controller 210, to limit access to defective dies in the flash memory package by controlling the disabling circuits 270a-270d. After sending commands to disable all the failed flash memory dies, the test controller 305 performs step 415.

Although one implementation of the method has been described, other implementations may perform the steps in different sequence, or a modified arrangement to achieve the same primary functions, which include identifying, disabling, and/or associating failure information with a defective die in a flash memory device. For example, the method 400 may perform steps 425 and 435 in a different order, or together in combination with the step 420. In some implementations, information about non-defective die information may be associated and/or labeled (as described herein) in addition or instead of information about defective die.

Various implementations may be applied to NOR flash and/or NAND flash die, either or both of which may be stacked together and/or adjacent to each other in a flash device, either alone, or with non-flash memory dies.

Although an exemplary flash memory device, which may contain one or more types of flash memory, has been described with reference to FIG. 1, other implementations may be deployed in other data storage applications, which may include, thumb drive or memory stick, for example. The die may be integrated into a package that uses vertically or horizontally (e.g., adjacent) stacked die arrangements. Such other data storage applications may involve multi-chip modules (MCM), system on a chip (SoC), application specific integrated circuits (ASICs), and the like. Packages may be arranged for example, as plated through hole (PTH) (e.g., DIP), zero insertion force (e.g., certain socketed packages, SIMM), and/or surface mount (SMT) (e.g., PLCC, LCC, BGA, PGA, BGA, or LGA) packages.

Although a test environment suitable for a manufacturer has been described with reference to FIG. 3, for example, testing of flash memory may also be performed in a product or electronic system after manufacturing is complete. Such self-diagnostic testing may be performed during operation, for example, in accordance with a maintenance schedule, in response to an operator request, and/or upon detecting a change in the bit error rate. In one example, the contents of a flash memory die may from time to time be copied to another storage location to allow for a verification testing of the flash memory die. If an unacceptable error rate is detected for the die, the die may be disabled by a controller, an example of which is the controller 210. In another example, the die identified as defective may be disabled by blowing a fuse, an example of which is any one of the fuses 255a-255d. As yet another example, the controllers 235 of the non-defective die may receive updated disable status information in the status registers 245. These and other disabling mechanisms, as described above, may be performed alone or in combination to disable the identified die.

To extend the life of a product that includes multiple flash memory dies, individual disabled die may be re-enabled during the product's useful life. For example, after 6 months of service, or after operating beyond a selected time, a previously disabled die (which may or may not have been identified as defective) may be re-enabled to provide information storage capacity for the product to thereby extend product life. The disabled memory may be re-enabled in response to a time (e.g., with reference to a real time clock) and/or events (e.g., upon detection of degraded flash memory capacity as the number of operational cycles increases.)

In some implementations, some of the above-described disabling mechanisms may be used to disable one or more dies dynamically. Dynamic die disabling may provide features such as, for example, price discrimination among different levels of storage capacity. In one example, an end user may only wish to purchase a limited storage capacity, and the appropriate number of dies may be temporarily disabled according to implementations described above. This may be implemented in some implementations by configuring the controller 210 to temporarily disable some or all of the CE pins 220a-220d. If the user later wishes to pay for additional storage capacity, appropriate ones of the flash memory dies 215a-215d may be enabled by re-configuring the controller 210 to permit additional ones of the CE pins 220a-220d to receive a chip enable signal.

In some implementations, disabling mechanisms may be arranged so as not to impede access or substantially increase access times to flash memory dies that are not disabled. For example, an external host processor system (not shown) may initiate a memory access operation to read or write the flash memory block 225a in the flash memory die 215a by sending a read or write command to the controller 210. The controller 210 may check the status of the flash memory die 215a and the enabling rules for the flash memory die 215a in the NVM 260. If it is appropriate to access the die 215a according to the status and the enabling rules, then the logic 265 may initiate an enabling signal to the CE1 pin 220a via the disabling circuit 270a. The enabling signal may then pass to the CE1 pin 240a. If the Vcc pin 230a is receiving electrical power, the controller 235a may receive the enabling signal. Upon receiving the enabling signal, the controller 235a may check the status register 245a. If the information in the status register 245a indicates that the flash memory die 215a is not defective, then the controller 235a may allow access to the flash memory die 215a to complete the memory operation.

Some implementations of the invention may be implemented in a computer system. For example, various implementations may include digital and/or analog circuitry, computer hardware, firmware, software, or combinations thereof. Apparatus can be implemented in a computer program product tangibly embodied in an information carrier, e.g., in a machine-readable storage device or in a propagated signal, for execution by a programmable processor; and methods can be performed by a programmable processor executing a program of instructions to perform functions of the invention by operating on input data and generating an output. The invention can be implemented advantageously in one or more computer programs that are executable on a programmable system including at least one programmable processor coupled to receive data and instructions from, and to transmit data and instructions to, a data storage system, at least one input device, and/or at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, which may include a single processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including, by way of example, semiconductor memory devices, such as EPROM, EEPROM, and flash memory devices; magnetic disks, such as internal hard disks and removable disks; magneto-optical disks; and, CD-ROM and DVD-ROM disks. The processor and the memory can be supplemented by, or incorporated in, ASICs (application-specific integrated circuits).

In some implementations, one or more user-interface features may be custom configured to perform specific functions. The invention may be implemented in a computer system that includes a graphical user interface and/or an Internet browser. To provide for interaction with a user, some implementations may be implemented on a computer having a display device, such as a CRT (cathode ray tube) or LCD (liquid crystal display) monitor for displaying information to the user, and a keyboard, and a pointing device, such as a mouse or a trackball by which the user can provide input to the computer.

In various implementations, flash memory controllers may communicate using suitable communication methods, equipment, and techniques. For example, the flash memory controller may send or receive messages over a bus and/or using point-to-point communication in which a message is transported directly from the source to the receiver over a dedicated physical link (e.g., fiber optic link, point-to-point wiring, and daisy-chain). The components of the system may exchange information by any form or medium of analog or digital data communication, including packet-based messages on a communication network. Examples of communication networks include, e.g., a LAN (local area network), a WAN (wide area network), MAN (metropolitan area network), wireless and/or optical networks, and the computers and networks forming the Internet. Other implementations may transport messages by broadcasting to all or substantially all devices that are coupled together by a communication network, for example, by using omni-directional radio frequency (RF) signals. Still other implementations may transport messages characterized by high directivity, such as RF signals transmitted using directional (i.e., narrow beam) antennas or infrared signals that may optionally be used with focusing optics. Still other implementations are possible using appropriate interfaces and protocols such as, by way of example and not intended to be limiting, USB 2.0, Firewire, ATA/IDE, RS-232, RS-422, RS-485, 802.11a/b/g, Wi-Fi, Ethernet, IrDA, FDDI (fiber distributed data interface), token-ring networks, or multiplexing techniques based on frequency, time, or code division. Some implementations may optionally incorporate features such as error checking and correction (ECC) for data integrity, or security measures, such as encryption (e.g., WEP) and password protection.

In some implementations, each flash memory controller and/or status register, for example, may be programmed with the same information and be initialized with substantially identical information stored in non-volatile memory. In other implementations, one or more flash memory devices may be custom configured to perform specific functions. For example, one flash program device may be configured to perform dynamic testing of die in its own package or in another flash memory die in another package. Such testing may be performed at intervals (e.g., which may be user selected), or according to a regular maintenance schedule. Upon identifying a failed die, the flash program device may generate signals to disable the identified die, whether in its own package or another package, using any single or combination of disabling mechanisms as described above. Such operations may be performed by a processor executing instructions to perform such operations.

A number of implementations of the invention have been described. Nevertheless, it will be understood that various modifications may be made without departing from the spirit and scope of the invention. For example, advantageous results may be achieved if the steps of the disclosed techniques were performed in a different sequence, if components in the disclosed systems were combined in a different manner, or if the components were replaced or supplemented by other components. The functions and processes (including algorithms) may be performed in hardware, software, or a combination thereof, and some implementations may be performed on modules or hardware not identical to those described. Accordingly, other implementations are within the scope of the following claims.

What is claimed is:

1. A method of operating a flash memory device having multiple flash memory dies, the method comprising:
    identifying one or more defective flash memory dies in a flash memory device;
    disabling memory access operations to each identified die; and
    labeling the flash memory device to indicate an amount of available flash memory in the flash memory device other than the identified die.

2. The method of claim 1, wherein disabling memory access comprises disabling a chip enable signal to each identified die.

3. The method of claim 2, wherein disabling a chip enable signal to each identified die comprises an operation selected from the group consisting of: disconnecting a bond wire, skipping installation of a bond wire for the chip enable signal, shorting out a signal used to generate a chip enable signal, disconnecting a chip enable pin on a package of the flash memory device, and providing an incomplete signal path for a chip enable signal.

4. The method of claim 1, wherein disabling memory access comprises disabling access to electrical power from the identified die.

5. The method of claim 4, wherein disabling access to electrical power from the identified die comprises an operation selected from the group consisting of: disconnecting a bond wire to supply power to the identified die, skipping installation of a bond wire to supply power to the identified die, laser fusing a power connection that supplies operating power to the identified die, blowing a fuse associated with the identified die, and providing an incomplete signal path for power to the identified die.

6. The method of claim 1, wherein disabling memory access comprises configuring a memory controller to disable access to the identified die.

7. The method of claim 6, wherein configuring a memory controller to disable access to the identified die comprises configuring a memory controller in the flash device to disallow requests to read from the identified die.

8. The method of claim 6, wherein configuring a memory controller to disable access to the identified die comprises configuring a memory controller in the flash device to disallow requests to write to the identified die.

9. The method of claim 6, wherein the configured memory controller is in the identified die.

10. The method of claim 1, further comprising storing an identifier to indicate information about available flash memory capacity based on the capacity of the dies in the flash memory device other than identified die.

11. The method of claim 10, wherein the identifier is stored in the flash memory device.

12. The method of claim 1, further comprising offering the flash memory device for sale.

13. A flash memory device having multiple flash memory dies, the device comprising:
    one or more non-defective flash memory dies;
    one or more flash memory die that have been identified as defective;
    means for disabling access to the die identified as defective; and
    a label on the flash memory device to indicate a storage capacity of the non-defective flash memory.

14. The flash memory device of claim 13, wherein the access disabling means comprises means for disabling a chip enable signal to the identified die.

15. The flash memory device of claim 13, wherein the access disabling means comprises means for disabling access to electrical power from the identified die.

16. The flash memory device of claim 13, wherein the access disabling means comprises means for rejecting requests to access to the identified die.

* * * * *

UNITED STATES PATENT AND TRADEMARK OFFICE
CERTIFICATE OF CORRECTION

| | | |
|---|---|---|
| PATENT NO. | : 7,609,561 B2 | Page 1 of 1 |
| APPLICATION NO. | : 11/334087 | |
| DATED | : October 27, 2009 | |
| INVENTOR(S) | : Cornwell et al. | |

It is certified that error appears in the above-identified patent and that said Letters Patent is hereby corrected as shown below:

On the Title page,

[*] Notice: Subject to any disclaimer, the term of this patent is extended or adjusted under 35 USC 154(b) by 281 days Delete the phrase "by 281 days" and insert -- by 553 days --

Signed and Sealed this

Twenty-fourth Day of August, 2010

David J. Kappos
*Director of the United States Patent and Trademark Office*